(12) United States Patent
Zhong et al.

(10) Patent No.: US 8,759,923 B2
(45) Date of Patent: *Jun. 24, 2014

(54) SEMICONDUCTOR DEVICE STRUCTURE AND METHOD FOR MANUFACTURING THE SAME

(75) Inventors: Huicai Zhong, Beijing (CN); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/131,745

(22) PCT Filed: Feb. 25, 2011

(86) PCT No.: PCT/CN2011/000308
§ 371 (c)(1),
(2), (4) Date: May 27, 2011

(87) PCT Pub. No.: WO2012/013009
PCT Pub. Date: Feb. 2, 2012

(65) Prior Publication Data
US 2013/0113025 A1 May 9, 2013

(30) Foreign Application Priority Data
Jul. 29, 2010 (CN) .......................... 2010 1 0241036

(51) Int. Cl.
*H01L 27/088* (2006.01)
(52) U.S. Cl.
USPC ................... 257/396; 257/288; 257/E21.4
(58) Field of Classification Search
USPC .............. 257/217, 244, 282, 283, 406, E21.4, 257/E21.457
See application file for complete search history.

(56) References Cited

U.S. PATENT DOCUMENTS

| 5,436,477 A | 7/1995 | Hashizume et al. |
| 6,410,392 B1 | 6/2002 | Sogo |
| 2002/0038402 A1* | 3/2002 | Kanaya .............................. 711/1 |
| 2004/0108558 A1 | 6/2004 | Kwak et al. |
| 2005/0104055 A1* | 5/2005 | Kwak et al. ....................... 257/2 |
| 2005/0230734 A1 | 10/2005 | Ha et al. |

FOREIGN PATENT DOCUMENTS

| CN | 1208963 | 4/2004 |
| GB | 1202338.8 A | 9/2012 |
| JP | 2005209980 | 8/2005 |

OTHER PUBLICATIONS

International Search Report and Written Opinion PCT/CN11/00308.
Office Action for GB1202338.8 dated Jan. 17, 2014.

* cited by examiner

*Primary Examiner* — Cheung Lee
(74) *Attorney, Agent, or Firm* — Troutman Sanders LLP

(57) ABSTRACT

The present invention provides a semiconductor device structure and a method for manufacturing the same. The method comprises: providing a semiconductor substrate, forming a first insulating layer on the surface of the semiconductor substrate; forming a shallow trench isolation embedded in the first insulating layer and the semiconductor substrate; forming a stripe-type trench embedded in the first insulating layer and the semiconductor substrate; forming a channel region in the trench; forming a gate stack line on the channel region and source/drain regions on opposite sides of the channel region. Embodiments of the present invention are applicable to manufacture of semiconductor devices.

7 Claims, 11 Drawing Sheets

SEMICONDUCTOR DEVICE STRUCTURE AND METHOD FOR MANUFACTURING THE SAME

BENEFIT CLAIMS

This application is a US National Stage of International Application No. PCT/CN2011/000308, filed Feb. 25, 2011, which claims the benefit of CN 201010241036.0, filed Jul. 29, 2010.

FIELD OF THE INVENTION

The present invention relates to the technical field of semiconductor device design and manufacture, in particular, to a semiconductor device structure in which the device performance is improved by channel engineering, and to a method for manufacturing the same.

BACKGROUND OF THE INVENTION

Semiconductor devices are continuously scaling down with the development of the semiconductor manufacture technology, and requirements on manufacture techniques for semiconductor devices are becoming higher and higher.

At present, the development of semiconductor manufacture technology has been achieved mainly by continually shortening the channel length of MOSFETs (Metal Oxide Semiconductor Field Effect Transistors), while the shortening of the channel length is achieved mainly by improving the semiconductor process techniques and raising the processing levels. Although the channel length has already been shortened to level of deep sub-micron and even nanometer, further shortening of the channel length is limited by many factors. On one hand, the improvement in the semiconductor processing techniques can hardly meet the needs of semiconductor manufacture; on the other hand, the physical performances of the devices also incur many problems, for example, Short-Channel Effects, DIBL (Drain-Induced Barrier Lowering) effects, too high threshold voltages, etc.

Therefore, adopting new materials, developing new processes, and building new device structures have become common goals in the semiconductor industry for further development of semiconductor manufacture technology. It has been fully accepted nowadays that a technical measure for effectively improving the physical performances of devices is to improve the mobility of carriers. The mobility of carriers is an important physical quantity indicating the moving speeds of carriers under electric field, the magnitude of which directly influences the operating frequencies and speeds of the semiconductor devices and circuits.

In the present mainstream technology, the carrier mobility is increased mainly through etching trenches in a substrate on both sides of the channel region and epitaxially growing strained source/drain regions in the trenches. For example, with respect to an nMOSFET, source and drain regions with a tensile stress are usually formed on both sides of the channel region by epitaxially growing Si:C with a certain percentage of C, so as to apply a tensile stress to the two sides of the channel; and with respect to a pMOSFET, the source and drain regions are formed by epitaxially growing SiGe with a certain percentage of Ge, so as to apply a compressive stress to the two sides of the channel.

However, such a method for forming source/drain regions cannot sufficiently increase the carrier mobility and improve the performances of the channel region. Hence, it is desirable to provide a novel semiconductor device structure and a method for manufacturing the same to improve the device performances.

SUMMARY OF THE INVENTION

One object of the present invention is to solve at least one of the above-mentioned technical problems, especially to provide a semiconductor device structure having an embedded channel and a method for manufacturing the same.

According to one aspect of the present invention, a method for manufacturing a semiconductor device structure is provided. The method comprises: providing a semiconductor substrate; forming a first insulating layer on a surface of the semiconductor substrate; forming a shallow trench isolation embedded in the first insulating layer and the semiconductor substrate; forming a stripe-type trench embedded in the first insulating layer and the semiconductor substrate; forming a channel region in the trench; and forming a gate stack line on the channel region and forming source/drain regions on opposite sides of the channel region.

If the shallow trench isolation is formed in the semiconductor substrate, the bottom of the trench is higher than the bottom of the shallow trench isolation.

Preferably, the first insulating layer comprises any one of or a combination of more than one of $Si_3N_4$, $SiO_2$, SiOx:F, SiCOH, $SiO_x$, $SiO_2$:C, SiCON, and SiONx.

Optionally, after forming the STI, the first insulating layer may be etched back firstly to a position lower than the top of the STI, and then a second insulating layer is deposited on the first insulating layer. The material of the second insulating layer may be the same as that of the first insulating layer.

According to one embodiment of the present invention, forming the channel region in the trench comprises: forming a third insulating layer at the bottom of the trench; and forming the channel region on the third insulating layer. Preferably, third insulating layer comprises any one of or a combination of more than one of $Si_3N_4$, $SiO_2$, SiOx:F, SiCOH, $SiO_x$, $SiO_2$:C, SiCON, and SiONx. The step of forming the third insulating layer may comprise: forming the third insulating layer in the trench, wherein a thickness of the third insulating layer on the sidewalls of the trench is less than a thickness of the third insulating layer at the bottom of the trench; and selectively etching the portions of the third insulating layer on the sidewalls of the trench, so that the third insulating layer only remains on the bottom of the trench.

Preferably, the step of forming the channel region comprises epitaxially growing the channel region with the exposed sidewalls of the trench as crystal growth seed. The material of the channel region may include any one of or a combination of more than one of Si, SiC, GaN, AlGaN, InP, and SiGe.

Optionally, the semiconductor substrate in the embodiment of the present invention is bulk silicon.

According to another embodiment of the present invention, the step of forming the gate stack line on the channel region comprises: forming a gate dielectric layer on the channel region; forming a gate electrode line on the gate dielectric layer; removing the first insulating layer; and forming a sidewall spacer surrounding the outside of the gate electrode line, wherein the gate electrode line is cut after forming the sidewall spacer and before completing the front-end-of-line process of the semiconductor device, so as to form electrically isolated gate electrodes. The step of cutting the gate electrode line comprises cutting the gate electrode line using reactive ion etching or laser cutting etching.

Optionally, after forming the source/drain regions, the method further comprises: removing the gate electrode line to form an opening inside the sidewall spacer; and forming a replacement gate electrode line in the opening Therefore, the embodiment of the present invention can be compatible with the replacement gate process.

Optionally, the gate electrode line is cut after forming the source/drain regions, so as to form the electrically isolated gate electrodes, and the method further comprises: forming an interlayer dielectric layer on the semiconductor substrate to fill in between the isolated gate electrodes; and etching the interlayer dielectric layer to form contact holes on the gate electrodes or the source/drain regions.

Optionally, after forming the source/drain regions, the method further comprises: forming a first interlayer dielectric layer; etching the first interlayer dielectric layer to form lower contact holes on the source/drain regions; forming lower contact portions in the lower contact holes; forming a second interlayer dielectric layer; etching the second interlayer dielectric layer to form upper contact holes on the gate electrode line or the source/drain regions; and forming upper contact portions in the upper contact holes, wherein, on the source/drain regions, the lower contact portions are aligned with the upper contact portions. Moreover, the gate electrode line is cut after forming the lower contact portions. It can be seen that the embodiment of the present invention is also compatible with the dual contact hole process.

According to another aspect of the present invention, a semiconductor device structure is provided. The semiconductor device structure comprises: a semiconductor substrate; a channel region buried in the semiconductor substrate and formed by epitaxial growth; a gate stack formed on the channel region; source/drain regions formed on opposite sides of the channel region.

The material of the channel region includes any one of or a combination of more than one of Si, SiC, GaN, AlGaN, InP, and SiGe. Optionally, an insulating layer is provided between the bottom of the channel region and the semiconductor substrate. The insulating layer may include any one of or a combination of ones of $Si_3N_4$, $SiO_2$, SiOx:F, SiCOH, $SiO_x$, $SiO_2$:C, SiCON, and SiONx, and have a thickness of 5-50 nm.

In the embodiment of the present invention, the semiconductor device structure further comprises a sidewall spacer formed only on lateral sides of the gate stack, the end of the sidewall spacer being flush with the end of the gate electrode in the direction of the gate width.

Preferably, in the direction of the gate width, a dielectric material is filled in between adjacent gate stacks, so as to achieve electrical isolation between the gate stacks, and the distance between adjacent gate stacks is 1-10 nm.

Optionally, the semiconductor device further comprises lower contact portions and upper contact portions, the lower contact portions being in contact with the source/drain regions and level with the top of the gate stack, and the upper contact portions being in contact with the top of the gate stack and the lower contact portions, respectively, wherein, on the source/drain regions, the lower contact portions are aligned with the upper contact portions.

The present invention provides a semiconductor device structure having a buried channel and a method for forming the same, which can greatly enhance the performances of MOSFETs by forming in the semiconductor substrate an epitaxial channel in which the carrier mobility is effectively increased. In addition, embodiments of the present invention also include a special process for cutting gate electrode lines thereby effectively improving the isolation between gate electrodes, simplifying the gate electrode etching and photolithography, and reducing the difficulty in OPC (Optical Proximity Correction). This process is also compatible with high-k dielectric/metal gate processes as well as replacement gate techniques.

Other aspects and advantages of the present invention will be given in the following description, some of which will be apparent from the following description or be learned from practices of the present invention.

BRIEF DESCRIPTION OF THE DRAWINGS

The above and/or additional aspects and advantages of the present invention will become apparent and easily understood from the following descriptions of the embodiments in conjunction with the drawings. The drawings of the present invention are schematic and are not drawn to scale, in which:

FIGS. 1-14a are cross sectional views of the structures in intermediate steps of the manufacturing method for the semiconductor device structure according to embodiments of the present invention.

Figure 1:
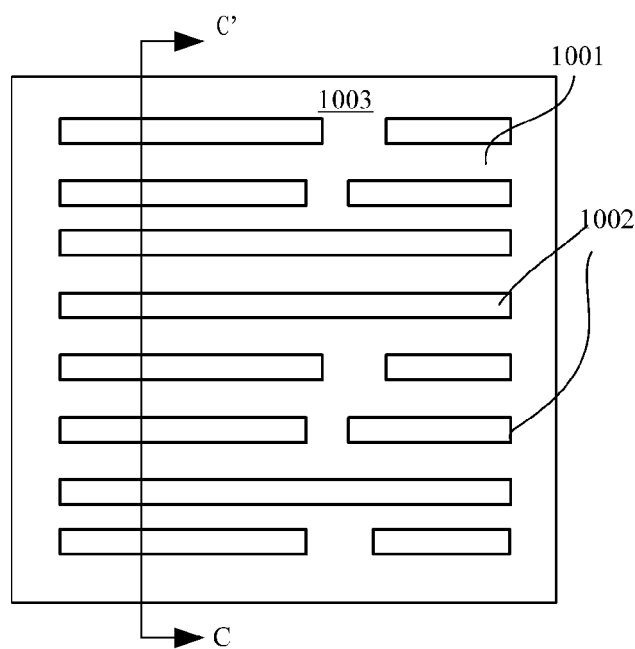

In the drawings, a figure number having the suffix "a" represents that the figure is a sectional view along the direction AA' in the plan view, a figure number having the suffix "b" represents that the figure is a sectional view along the direction BB' in the plan view, and a figure number having the suffix "c" represents that the figure is a sectional view along the direction CC' in the plan view.

DETAILED DESCRIPTION OF PREFERRED EMBODIMENTS

The embodiments of the present invention will be described in detail below, and examples of said embodiments are shown in the figures. Throughout the drawings, the same or similar reference numbers represent the same or similar elements or elements having the same or similar functions. The embodiments described below with reference to the drawings are exemplary, which are only for illustrating the present invention instead of limiting the present invention.

The following disclosure provides a plurality of different embodiments or examples to achieve different structures of the present invention. To simplify the disclosure of the present invention, description of the components and arrangements of specific examples is given below. Of course, they are only illustrative and not intended to limit the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

FIGS. 1-14a are cross sectional views of the structures in the intermediate steps of the manufacturing method for the semiconductor device structure according to embodiments of the present invention. The method for manufacturing a semiconductor device structure according to embodiments of the present invention as well as the device structure obtained thereby will be described in detail below with reference to FIGS. 1-14a.

First, as shown in FIG. 1, a semiconductor substrate 1000 is provided. In an embodiment of the present invention, the substrate 1000 is, for example, bulk silicon, but in practice, the substrate may comprise any suitable semiconductor substrate material, which may be, but not limited to, silicon, germanium, silicon germanium, SOI (Silicon On Insulator), silicon carbide, gallium arsenide, or any group III/V compound semiconductor, and so on. According to design specifications known in the prior art (for example, a p-type substrate or an n-type substrate), the substrate 1000 may comprise various kinds of doping configurations. In addition, the substrate 1000 may optionally comprise an epitaxial layer such that it may be manipulated under stress, so as to enhance the performances.

Figure 1C:
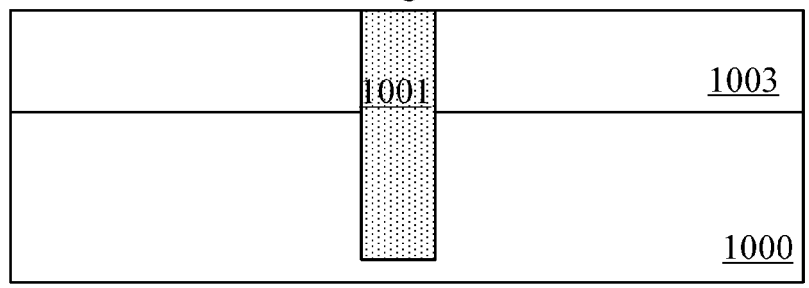

As shown in FIGS. 1 and 1c, STIs (shallow trench isolations) 1001 and active regions 1002 are formed on the semiconductor substrate 1000. First, a first insulating layer 1003 is formed on the surface of the semiconductor substrate 1000. FIG. 1c is a cross sectional view along the direction CC' in FIG. 1. The first insulating layer 1003 may comprise any one of or a combination of more than one of $Si_3N_4$, $SiO_2$, SiOx:F, SiCOH, $SiO_x$, $SiO_2$:C, SiCON, and SiONx. In one embodiment of the present invention, $Si_3N_4$ is preferable. Then, the first insulating layer 1003 and the semiconductor substrate 1000 are etched to form trenches according to the desired shape of STIs 1001, and the trenches are filled with oxide, e.g. $SiO_2$, to form STIs 1001.

For the sake of convenience, only one STI structure 1001 is shown in FIG. 1c.

Optionally, before forming the first insulating layer 1003, an oxide layer may be formed on the semiconductor substrate 1000 by conventional thermal oxidation or other deposition processes. For clearness, said oxide layer is not shown in the figures.

After forming the STI regions, the first insulating layer 1003 may be optionally etched back to a position lower than the top of the STI, and then a second insulating layer is deposited, the material of which is the same as that of the first insulating layer. Forming the second insulating layer will facilitate the formation of a better surface.

Figure 2:
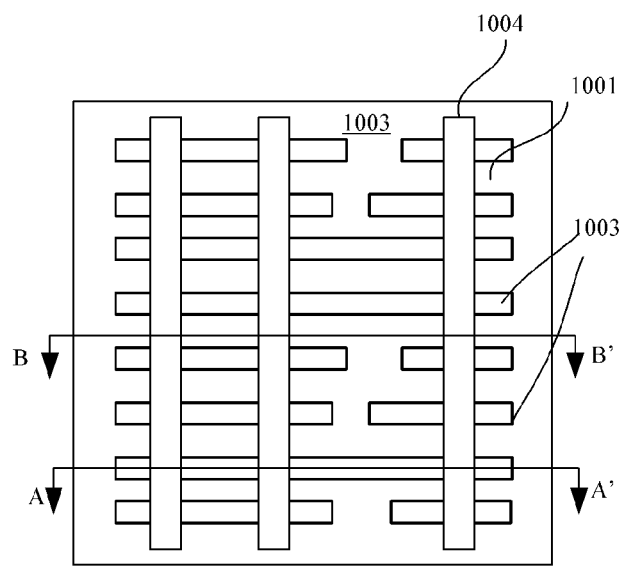

Next, a photoresist layer is coated on the semiconductor structure having STIs 1001 formed therein, and is then patterned according to the shape of the gate electrode lines to be formed. Finally, a photoresist pattern 1004 as shown in FIG. 2 is formed. The first insulating layer 1003 and the semiconductor substrate 1000 are selectively etched with the photoresist shown in FIG. 2 as a mask. For example, in one embodiment of the present invention, the first insulating layer 1003 is $Si_3N_4$, and the STIs are filled with $SiO_2$. So, $Si_3N_4$ and Si are selectively etched with respect to $SiO_2$ in this etching. Finally, trenches 1005 are formed which are embedded in the first insulating layer 1003 and the semiconductor substrate 1000. The bottom of the trenches 1005 is higher than that of STIs 1001, so that STIs can also provide a function of isolation.

Alternatively, if the second insulating layer is formed, when forming the stripe-type trenches 1005 by etching process, the etching starts from the second insulating layer and then goes down.

Figure 2A:
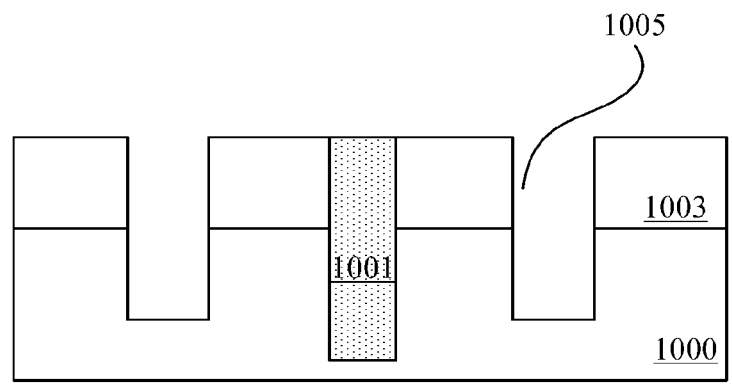
Figure 2B:
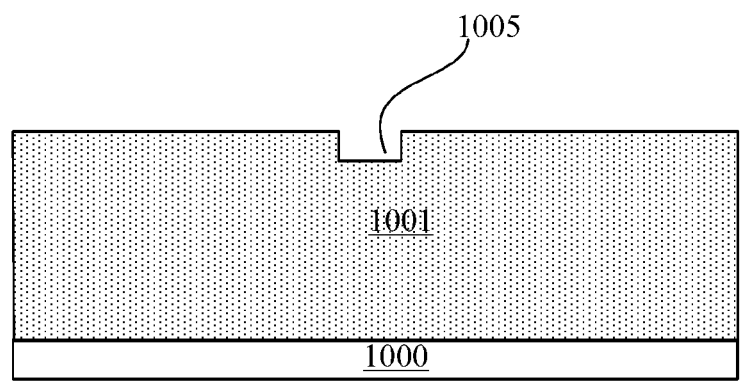

FIGS. 2a and 2b are the sectional views in the directions of BB' and CC' of FIG. 2, respectively, which clearly show the result of the selectively etching as described above. FIG. 2b shows that said etching has little impact on the STI and only a very shallow trench 1005 is formed.

For the sake of convenience, in the subsequent schematic drawings, the suffixes "a" and "b" in the figure numbers represent, respectively, sectional views along the directions of AA' and BB', unless otherwise stated.

Figure 3:
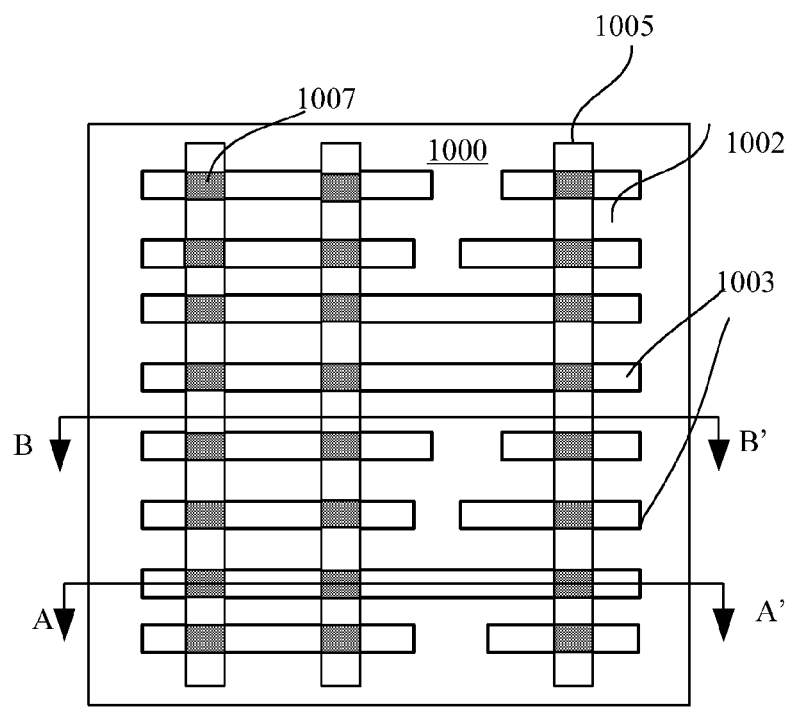
Figure 3A:
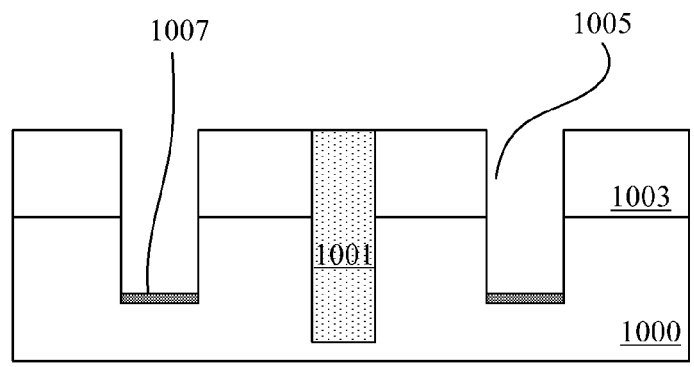
Figure 3B:
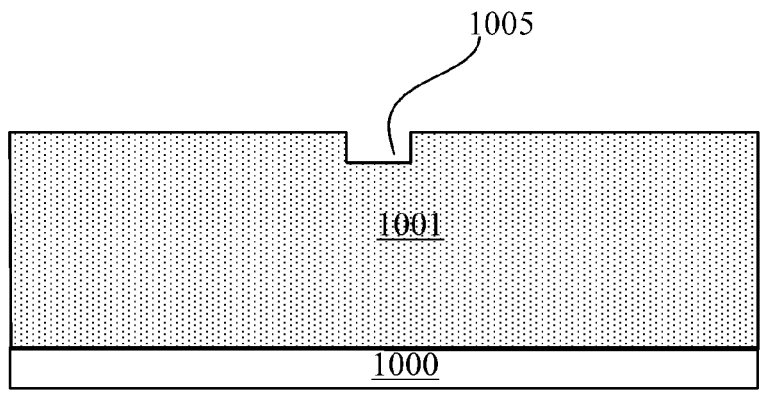

As shown in FIGS. 3, 3a, and 3b, a third insulating layer 1007 may optionally formed on the trenches 1005, and the third insulating layer 1007 may comprise any one of or a combination of more than one of $Si_3N_4$, $SiO_2$, SiOx:F, SiCOH, $SiO_x$, $SiO_2$:C, SiCON, and SiONx. The process of forming the third insulating layer may be, but not limited to, thermal oxidation, ALCVD (Atomic Layer Chemical Vapor Deposition), or other deposition processes. The third insulating layer 1007 can adjust the thickness of the channel region to be formed later and increase the switching speed of the device. For example, when forming the third insulating layer in the trench, a structure can be obtained in which a relatively thick insulating layer is formed at the bottom of the trench while a very thin or almost no insulating layer is formed on the sidewalls of the trench by using the selective ALCVD process. After forming the third insulating layer in the trenches, a selective wet chemical etching or dry chemical etching may be performed to expose the sidewalls of the trenches, leaving the insulating layer (with a thickness of 5-50 nm) at the bottom of the trenches. The third insulating layer 1007 can adjust the thickness of the channel regions to be formed later, and can also increase the switching speed of the devices.

Figure 4:
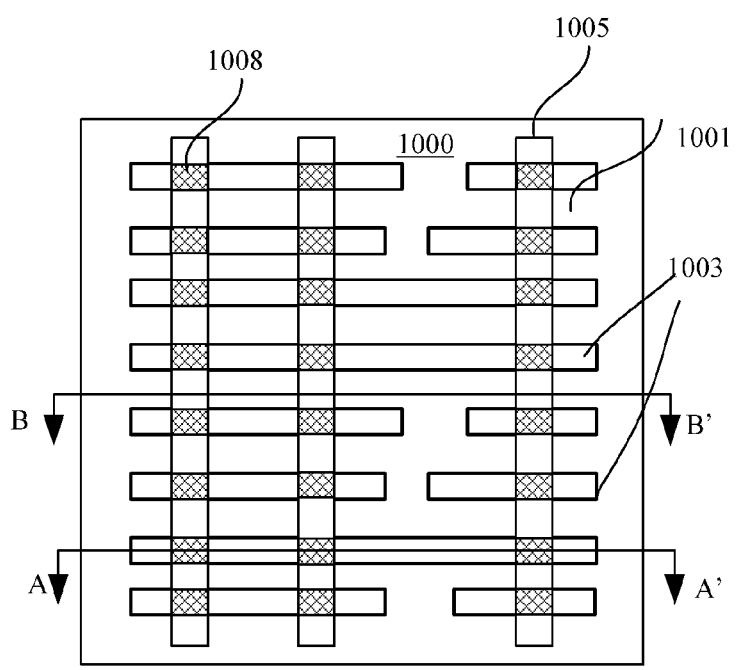
Figure 4A:
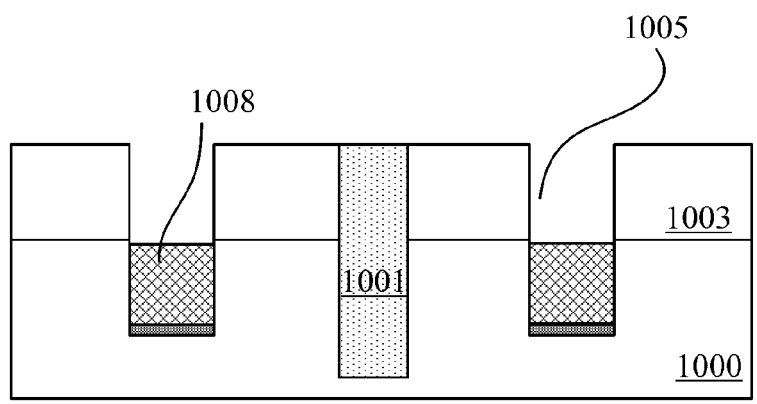
Figure 4B:
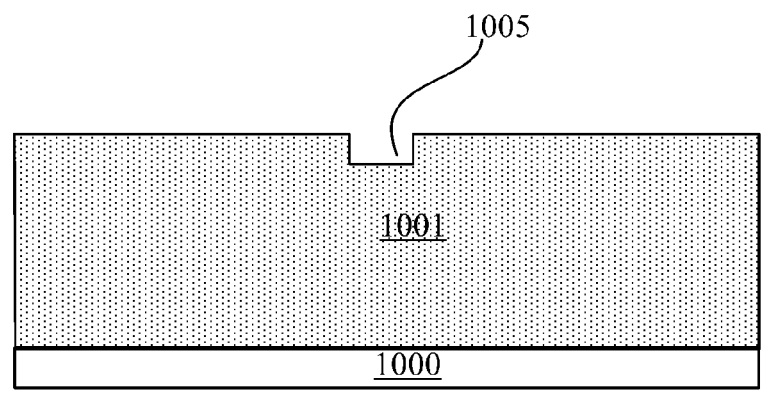

Then, as shown in FIGS. 4, 4a, and 4b, channel regions 1008 are grown epitaxially with the exposed sidewalls of the groove 1005 as the crystal seed. For example, any one of or a combination of more than one of Si, SiC, GaN, AlGaN, InP, and SiGe may be grown epitaxially, so as to form the channel regions 1008. For example, a percentage of Ge in SiGe or a percentage of C in SiC may be selected as required, so as to adjust the stress in the channel region. For example, with respect to a pMOSFET, Si:C may be grown epitaxially, and with respect to an nMOSFET, SiGe may be grown epitaxially. The thickness of the channel regions formed in this way is adjustable, the concentration of the impurities in the channel regions can be selected, and stress can be generated in the channel regions. Thus, the carrier mobility and device performances can be effectively improved.

After forming the channel regions, the gate stack lines and the source and drain regions may be formed by conventional processes or processes as described in embodiments of the present invention.

Figure 5:
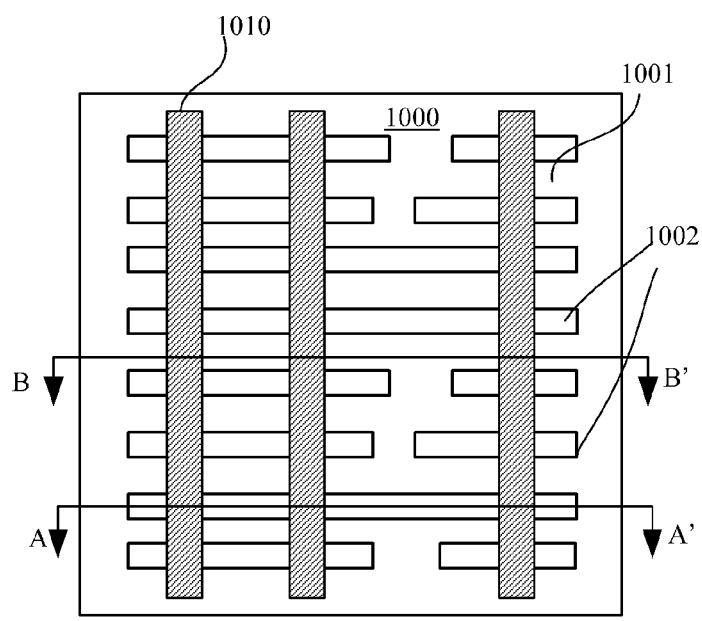
Figure 5A:
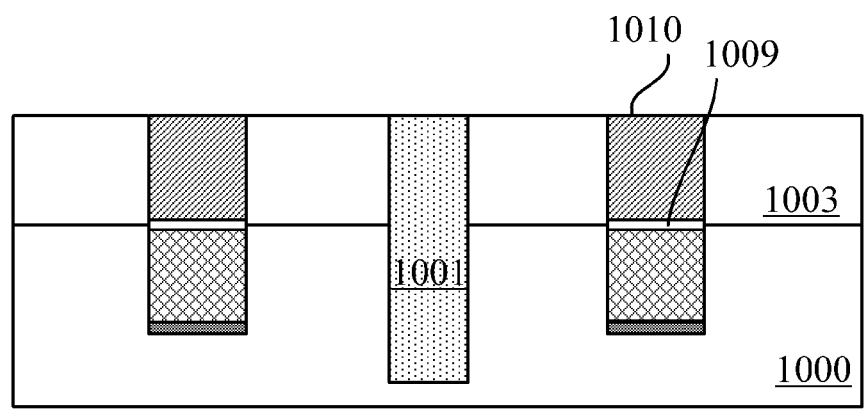
Figure 5B:
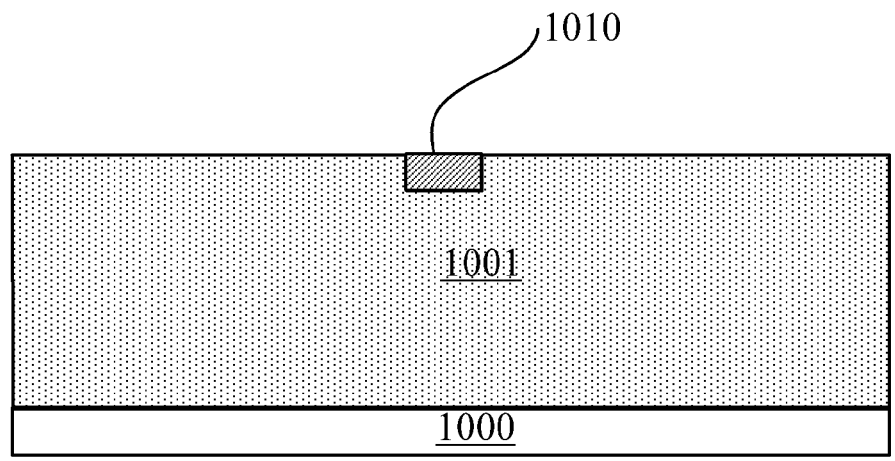

As shown in FIGS. 5, 5a, and 5b, a gate dielectric layer 1009 is formed on the channel regions. The gate dielectric layer 1009 may be of a conventional dielectric material, or of a high-k dielectric material, e.g. any one of or a combination of more than one of $HfO_2$, $HfSiO_x$, HfSiNOx, HfTaOx, HfTiOx, HfZrOx, $Al_2O_3$, $La_2O_3$, $ZrO_2$, and LaAlOx. The process for forming the dielectric layer may be such processes as thermal oxidation, sputtering, and deposition. The high-k gate dielectric layer can suppress the short channel effects of the device. Afterwards, gate electrode lines 1010 are formed on the gate dielectric layer 1009. Specifically, a layer of conductive material, for example, Poly-Si, Ti, Co, Ni, Al, W, metal alloy, or other materials, may be deposited on the entire semiconductor device structure, and then a CMP (Chemical Mechanical Polishing) is performed on the entire semiconductor device structure with the first insulating layer 1003 as a stopper.

FIG. 5b shows that the gate electrode lines 1010 on the STI 1001 are very thin.

Figure 6A:
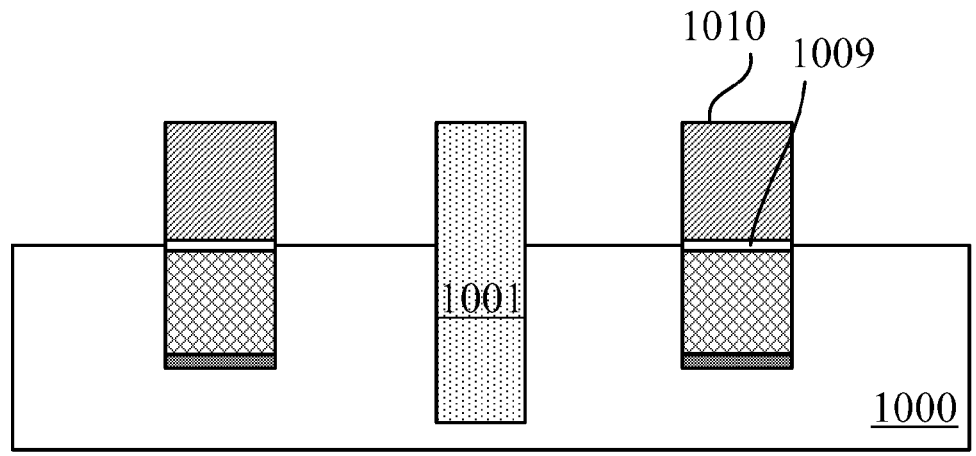
Figure 6B:
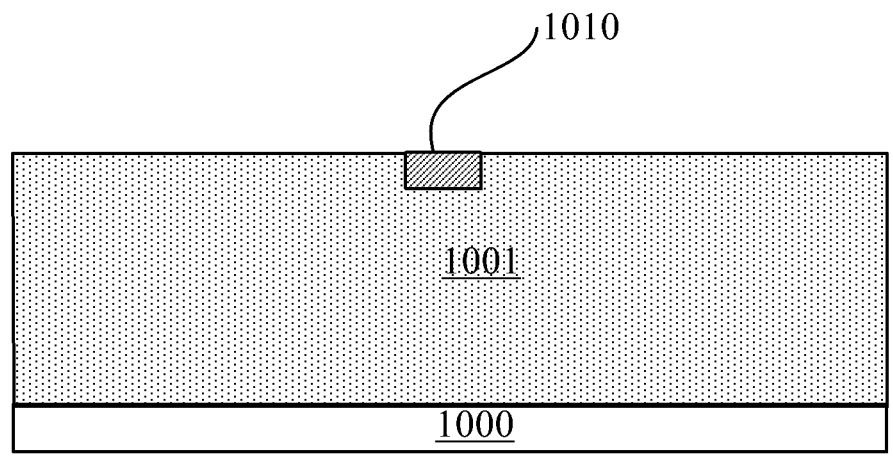

Next, the first insulating layer 1003 is removed by such processes as wet etching, dry etching, or the like, so as to form the structure as shown in FIGS. 6a and 6b. For example, hot phosphoric acid can be used to etch Si$_3$N$_4$.

Then, optionally, a portion of the STI 1001 that is higher than the substrate 1000 in FIG. 6a may be removed, for example, by etching using HF.

Figure 7:
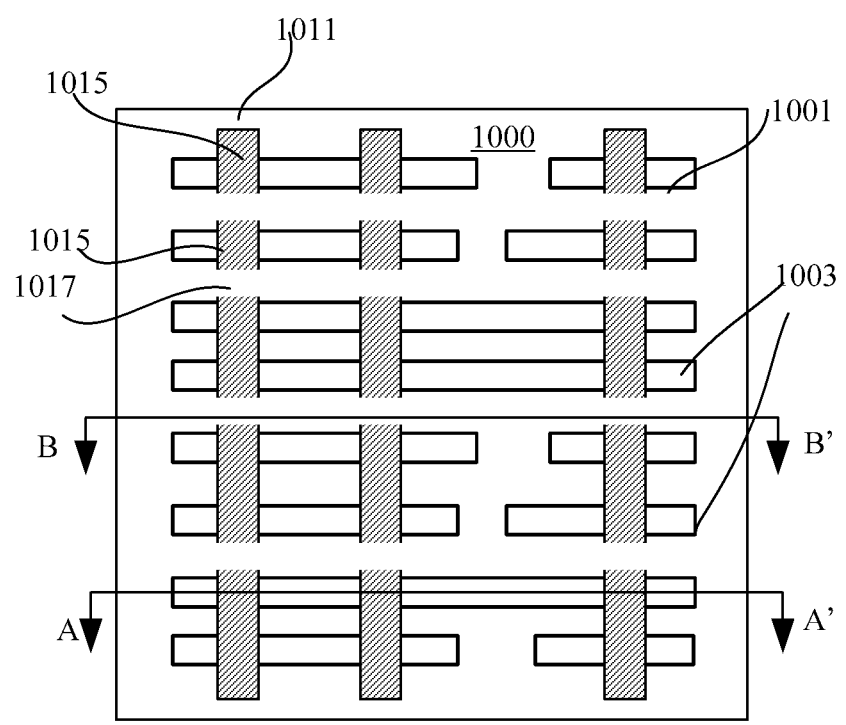

According to conventional processes, the embodiment of the present invention may use a photolithography mask once again to cut the gate electrode lines into gate electrodes. As shown in FIGS. 7, 8, 8a, and 8b, the gate electrode lines 1010 are cut according to a conventional process to form electrically isolated gate electrodes 1015. FIG. 7 schematically shows cuts 1017 etched out by using the mask, and the formation of the cuts may completely depend on the requirements of the device.

Figure 8:
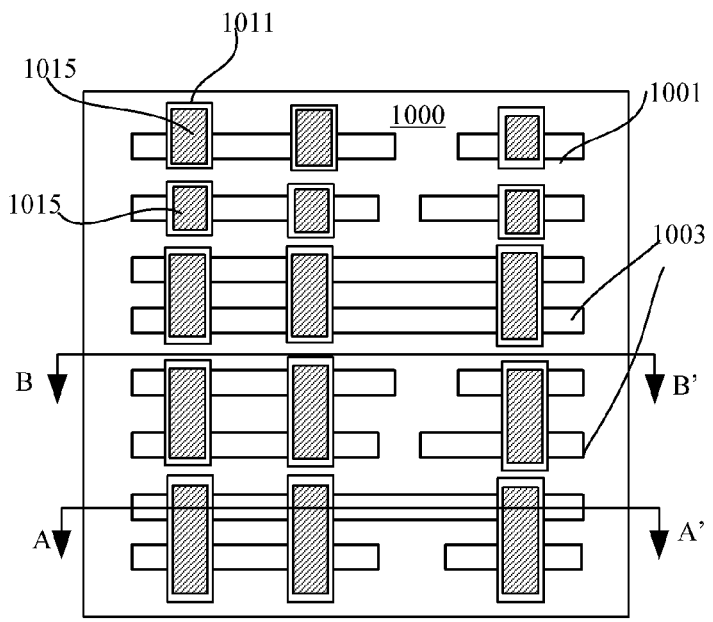
Figure 8A:
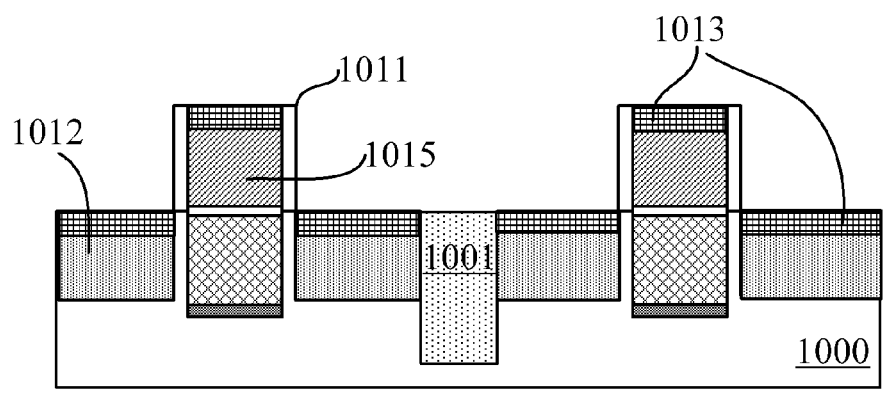

As shown in FIG. 8a, a sidewall spacer 1011 is formed surrounding the outside of the gate electrode 1015, and source/drain regions 1012 are formed on opposite sides of the channel region 1008.

Specifically, a tilted angle ion implantation may be performed firstly on the substrate region on both sides of the channel region 1008 to form the source/drain extension regions. Optionally, a halo ion implantation may also be adopted to form source/drain halo implantation regions. Then, a sidewall spacer 1011 is formed surrounding the outside of the gate electrode 1015. According to embodiments of the present invention, the shape or material of the sidewall spacer formed is not limited, and the shape of the sidewall spacer shown in FIGS. 8 and 8a are only examples. Next, a heavy doping ion implantation is performed on both sides of the channel region 1008 to form source/drain regions 1012. Similarly, the shape of the source/drain regions 1012 shown in FIG. 8a is merely an example.

Figure 8B:
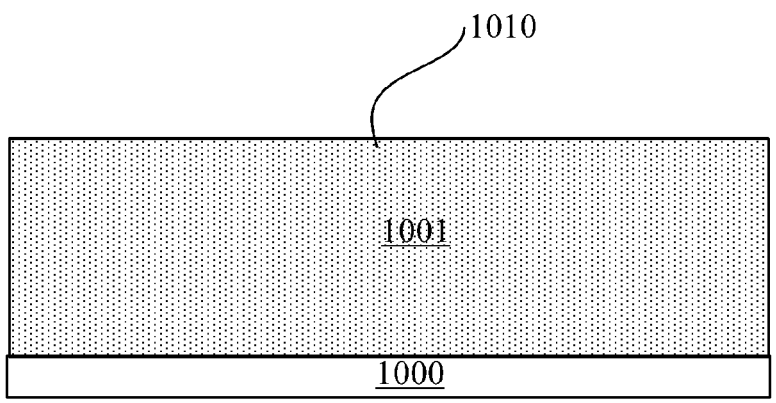

Metal silicide contacts may be formed on the source/drain regions 1012 and the gate electrode 1015 as desired. First, a layer of metal, e.g. Ni, Co, W, etc., is deposited on the entire semiconductor device structure. Then, a rapid annealing is performed to form metal silicide contacts and the unreacted metal is removed. Finally, the metal silicide 1013 as shown in FIG. 9a is formed. While removing the unreacted metal, the very thin metal of the gate electrode lines 1010 on the STI might also be removed, as shown in FIG. 8b.

So far, the semiconductor device structure according to one embodiment of the present invention is formed. As shown in FIGS. 8, 8a, and 8b, said semiconductor device structure comprises: a semiconductor substrate 1000; a channel region 1008 buried in the semiconductor substrate 1000 and formed by epitaxial growth; a gate stack formed on the channel region 1008; and source/drain regions 1012 formed on opposite sides of the channel region 1008.

Preferably, the material of the channel region includes any one of or a combination of more than one of Si, SiC, GaN, AlGaN, InP, and SiGe.

Moreover, there is an insulating layer 1007 between the bottom of the channel region 1008 and the semiconductor substrate 1000. Said insulating layer 1007 may include any one of or a combination of more than one of Si$_3$N$_4$, SiO$_2$, SiOx:F, SiCOH, SiO$_x$, SiO$_2$:C, SiCON, and SiONx, and may have a thickness of 5-50 nm.

The lower surface of the insulating layer 1007 is higher than the bottom of the STI 1001 as shown in the figures, so as to achieve a better effect of isolation.

In the semiconductor device structure obtained according to one embodiment of the present invention, the thickness of the channel regions is adjustable, the concentration of the impurities in the channel regions can be selected, and the stress can be effectively adjusted. For example, a percentage of Ge in SiGe or a percentage of C in SiC can be selected as desired, so the carrier mobility can be effectively increased and the device performance can be improved.

In this embodiment of the present invention, a replacement gate process may be optionally used. After forming the source/drain regions, the gate electrode may be removed, and then the replacement gate electrode may be formed.

The method for manufacturing a semiconductor device structure according to another embodiment of the present invention is described below. Following the structure shown in FIGS. 6, 6a, and 6b, steps detailed hereinafter are performed instead of directly cutting the gate electrode lines.

Figure 9:
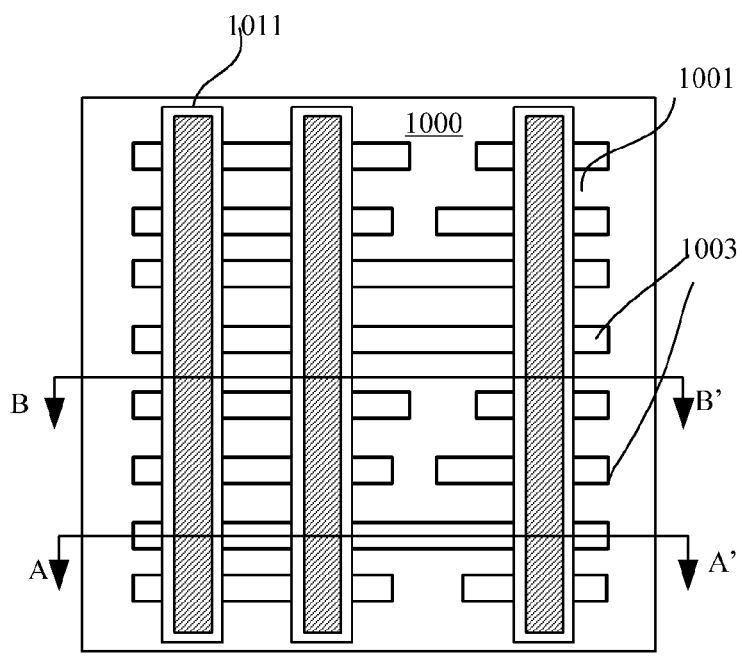
Figure 9A:
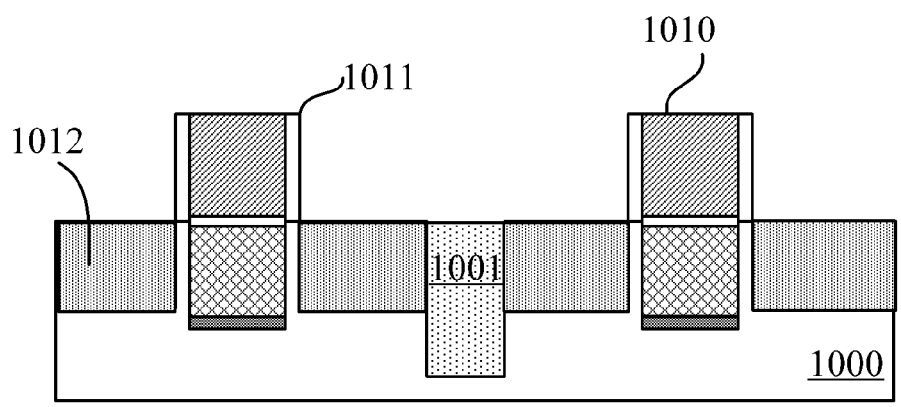
Figure 9B:
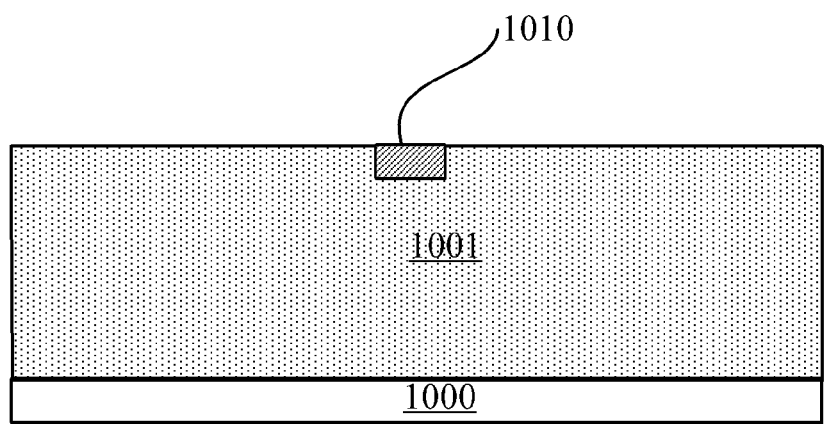

As shown in FIGS. 9, 9a, and 9b, a sidewall spacer 1011 is formed on the outside of the gate electrode line 1010, and source/drain regions 1012 are formed on opposite sides of the channel region 1008. The processes for forming the sidewall spacer 1011 and the source/drain regions 1012 have been described in the above embodiment and are thus omitted here. Therefore, the shape of the sidewall spacer and the shape of the source/drain regions as shown in FIGS. 9, 9a, and 9b are merely examples.

Figure 10A:
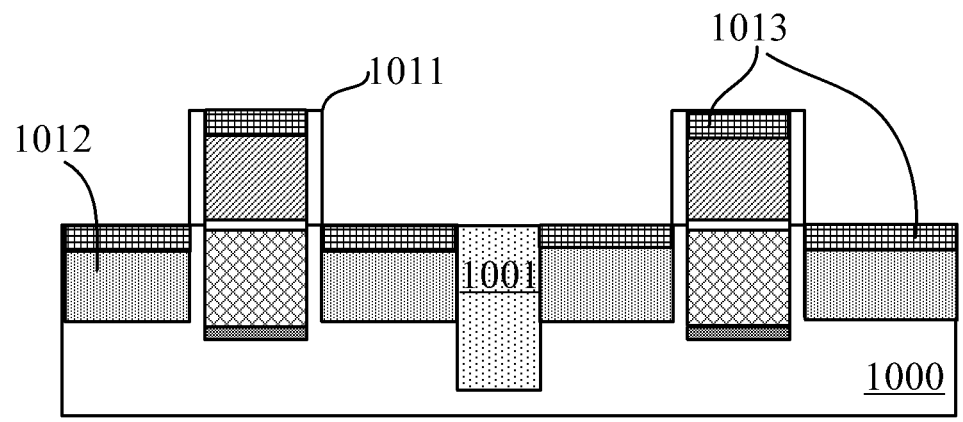

Then, metal silicide contacts are formed on the source/drain regions 1012 and the gate electrode lines 1010. The process for forming the metal silicide contacts has been described in the above embodiment and is thus omitted here. As a result, a structure as shown in FIG. 10a is formed.

Figure 11:
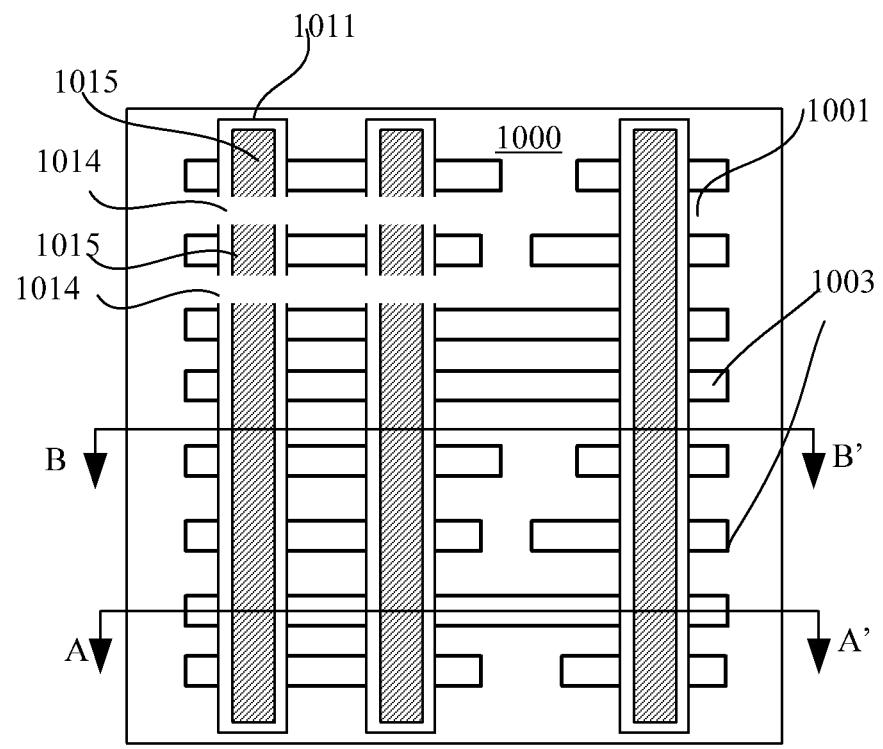

The gate electrode lines 1010 may be cut at this stage. As shown in FIG. 11, the gate electrode lines 1010 and the sidewall spacer 1011 above STIs 1001 are cut using laser cutting etching or RIE (reactive ion etching), thereby to form cuts 1014 and gate electrodes 1015 that are electrically isolated from each other. Optionally, the gate electrode lines 1010 above the STI as shown in FIG. 9b may also be cut off at the same time. For the sake of convenience, only two cuts are shown in the figures, but the cutting can be performed as desired according to the present invention.

In conventional processes, the gate electrode lines are cut after they are formed as shown in FIG. 6. However, in subsequent processes, for example, in the process of forming sidewall spacers, the cuts are very small and it is hard to fill the insulating material for sidewall spacers thereinto, it is very likely that a short will occur between the gate electrodes in subsequent processes. For example, during the process of the ion implantation for source/drain regions or the formation of the metal silicide, a short between the gate electrodes would likely to occur. In this embodiment of the present invention, the gate electrode lines are cut after forming metal silicide. In subsequent processes, insulating dielectric will be filled, thereby effectively preventing shorts between adjacent gate electrodes. Even if the cuts are very small, the requirements for electrical isolation between gate electrodes can still be met. Such a method according to the present invention does not need high precision masks or OPC and thus simplifies the manufacture processes.

Figure 12:
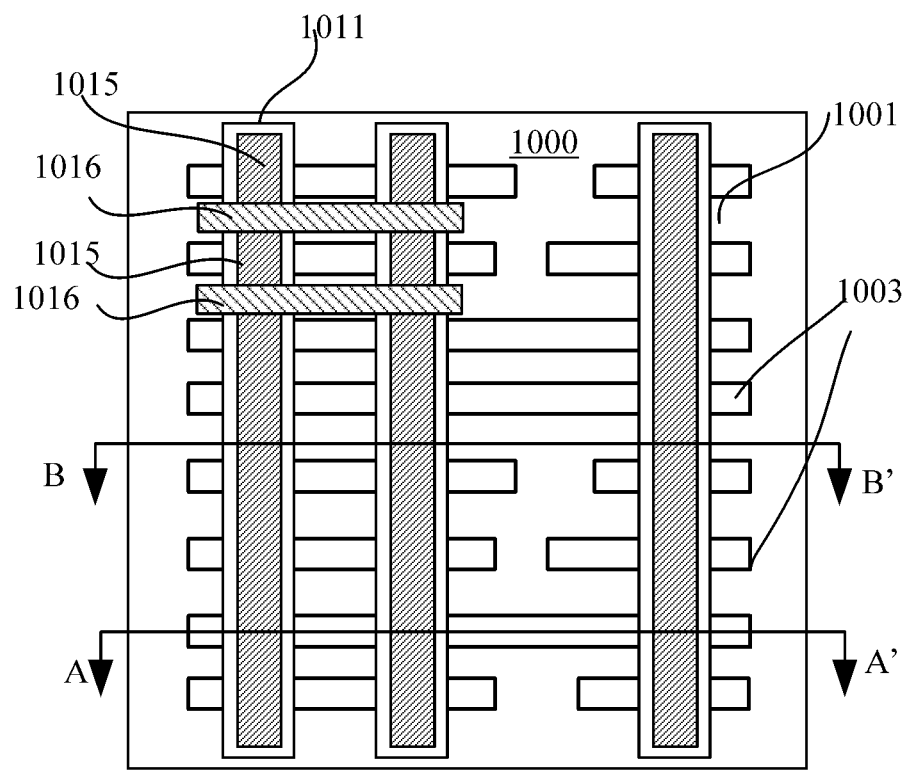
Figure 12A:
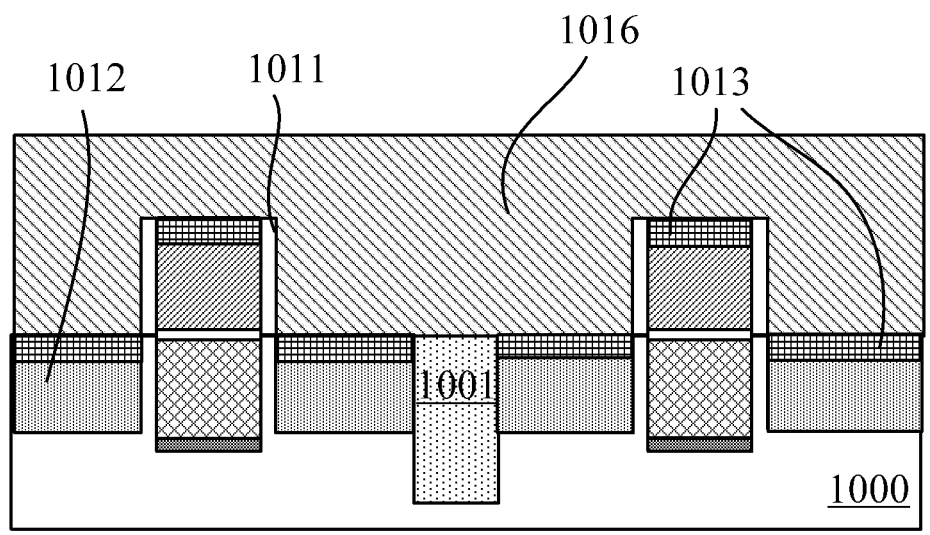
Figure 12B:
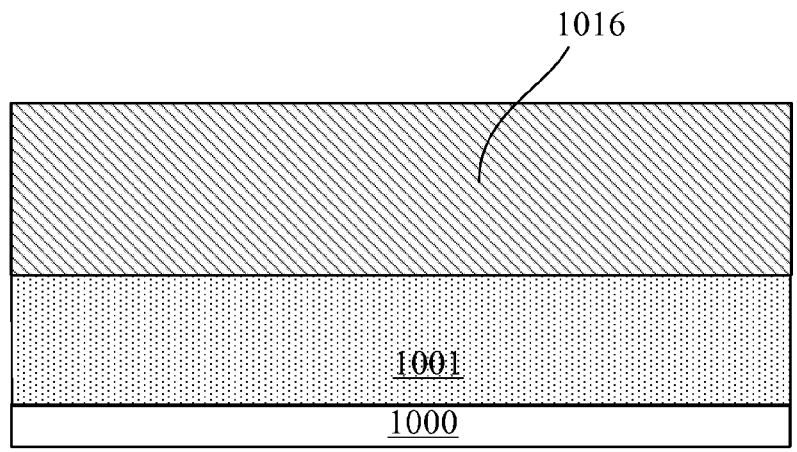

Next, an interlayer dielectric layer may be deposited. As shown in FIGS. 12, 12a, and 12b, after depositing the interlayer dielectric layer, the cuts 1014 are filled up with a dielectric material 1016, which further ensures the electrical isolation between gate electrodes 1015.

Then, contact holes and contacts may be formed using conventional processes to finish the device structure. The conventional processes will not be detailed herein.

So far, a semiconductor device structure according to another embodiment of the present invention is formed. As shown in FIGS. 12, 12a, and 12b, said semiconductor device structure comprises: a semiconductor substrate 1000; a channel region 1008 buried in the semiconductor substrate 1000 and formed by epitaxial growth; a gate stack formed on the channel region 1008; source/drain regions 1012 formed on opposite sides of the channel region 1008.

Preferably, the material of the channel region 1008 comprises any one of or a combination of more than one of Si, SiC, GaN, AlGaN, InP, and SiGe. Besides, there is an insulating layer 1007 between the bottom of the channel region 1008 and the semiconductor substrate 1000. The insulating layer 1007 may comprise any one of or a combination of more than one of $Si_3N_4$, $SiO_2$, SiOx:F, SiCOH, $SiO_x$, $SiO_2$:C, SiCON, and SiONx. The lower surface of the insulating layer 1007 is higher than the bottom of the STIs 1001 as shown in the figures, so as to achieve the isolation.

In addition, said semiconductor device structure comprises a sidewall spacer 1011, which is formed only on lateral sides of the gate electrode 1015, and the ends of the sidewall spacer 1011 are flush with the ends of the gate electrode 1015 in the direction of the gate width.

Preferably, a dielectric material 1016 is filled in between adjacent gate electrodes in the direction of the gate width to achieve electrical isolation between the gate electrodes. The distance between adjacent gate electrodes is preferably 1-10 nm.

In the semiconductor device structure according to the embodiments of the present invention, in the direction parallel to the gate width, the cuts between the gate electrodes are parallel, and there is dielectric material filled in between the cuts, so as to effectively isolate the gate electrodes from each other, thereby realizing better device performances.

In this embodiment of the present invention, a replacement gate process may be optionally used. In this case, after forming the source/drain regions, the gate electrode lines may be removed, and then replacement gate electrode lines may be formed.

The processes of gate electrode line cutting as adopted by the embodiment of the present invention can greatly reduce the proximity effect that makes the photolithography, etching, or OPC complicated, and can make it easier to etch the gate electrode and to control the width of the gate electrode. The processes according to the embodiment of the present invention relax the design rule of the semiconductor process and can further reduce the chip size.

Embodiments of the present invention are also favorable to the high-k metal gate processes of 45 nm and below. The processes for cutting gate electrode lines in embodiments of the present invention can also be effectively applied to the patterning of the active regions.

FIGS. 13a-14a are the sectional views of structures in respective steps of the method for manufacturing a semiconductor device structure according to another embodiment of the present invention. After forming the structure as shown in FIG. 6, or after performing the replacement gate processes, the contact holes for the contacts are formed by respectively forming lower contact holes and upper contact holes, and the gate electrode lines are cut after forming the lower contact hole. The specific steps of manufacturing the semiconductor device structure according to the embodiment of the present invention will be described in detail hereinafter with reference to FIGS. 13a-14a.

Figure 13A:
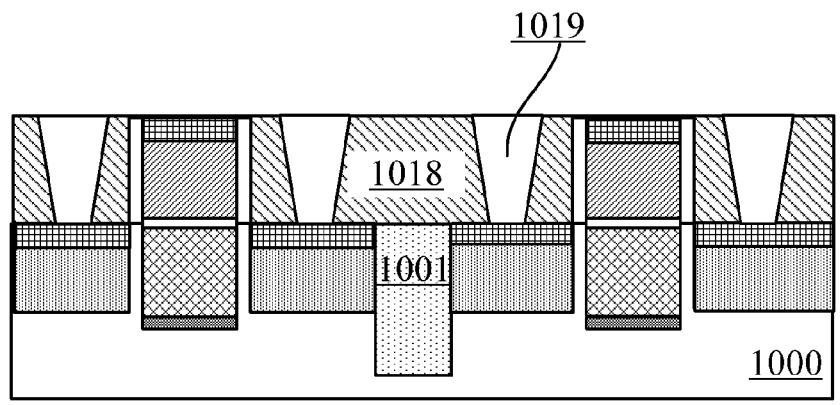

As shown in FIG. 13a, an interlayer dielectric layer 1018 is deposited on the entire semiconductor device structure. Optionally, the interlayer dielectric layer 1018 can be polished by, for example, CMP, until the top of the gate electrode lines 1010 is exposed. Then, lower contact holes 1019 are formed in the interlayer dielectric layer 1018, which is filled with a conductive material, e.g. a metal, such as W. Afterwards, the entire semiconductor device structure is polished until the top of the gate electrode lines 1010 is exposed, thereby forming lower contacts (also indicated by 1019 in the figures) that are of the same height as the top of the gate conductor layer.

Then, the gate electrode lines 1004 may be cut as shown in FIG. 11 to form gate electrodes 1015 and parallel cuts 1014 electrically isolating the gate electrodes 1015.

Figure 14A:
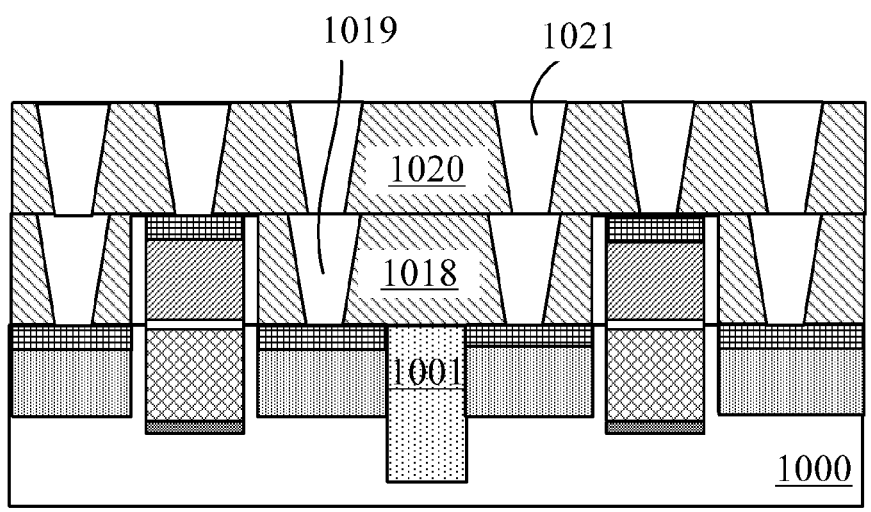

As shown in FIG. 14a, an interlayer dielectric layer 1020 is deposited on the entire semiconductor device structure, so at this time, the dielectric material of the interlayer dielectric layer can fill up the parallel cuts 1014. Afterwards, the interlayer dielectric layer 1020 is etched, so as to form upper contact holes 1021 on the gate electrode 1015 and the lower contact holes 1019. Likewise, a conductive material, e.g. a metal, such as W, is filled into the upper contact holes 1021. Then, the entire semiconductor device structure is polished to form the upper contacts (also indicated by 1021 in the figures) on the gate stack and/or the source/drain regions 1012. On the source/drain regions 1012, the lower contacts 1019 are aligned with the upper contacts 1021.

It can be seen that the embodiment of the present invention is compatible with not only the replacement gate processes but also the dual contact hole formation processes. The dual contact hole formation processes can effectively prevent shorts between the gate electrodes, thereby improving the quality and performances of the semiconductor device.

FIG. 14a is a sectional view of a semiconductor device structure obtained according to yet another embodiment of the present invention. In addition to the structure shown in FIGS. 12, 12a, and 12b, the structure according to this embodiment further comprises lower contacts 1019 and upper contacts 1021. The top of the lower contacts 1019 is of the same height as the top of the gate stacks, so the upper contacts 1021 on the gate stacks and the source/drain regions are also of the same height. Such a device structure can reduce the difficulty in the contact hole formation processes.

Although the embodiments of the present invention have been shown and described above, it is readily apparent to those having ordinary skills in the art that the scope to which the present invention is applied is not limited to the process, mechanism, manufacture, material composition, means, methods, and steps described in the specific embodiments in the specification. A person of ordinary skills in the art would readily appreciate from the disclosure of the present invention that the process, mechanism, manufacture, material composition, means, methods, or steps currently existing or to be developed in future, which perform substantially the same functions or achieve substantially the same effects as that in the corresponding embodiments described in the present invention, may be applied according to the present invention. Therefore, it is intended that the scope of the appended claims of the present invention includes these process, mechanism, manufacture, material composition, means, methods, or steps.

What is claimed is:

1. A semiconductor device structure, comprising:
   a semiconductor substrate;
   a channel region buried in the semiconductor substrate and formed by epitaxial growth;
   a gate stack formed on the channel region;
   source/drain regions formed on opposite sides of the channel region,
   wherein the semiconductor device structure further comprising a sidewall spacer formed only on lateral sides of the gate stack,
   wherein in the direction of gate width, a cut is positioned between adjacent gate stacks and adjacent sidewall spacers, and a dielectric material is filled in the cut, so as to achieve electrical isolation between the gate stacks, wherein the end of the sidewall spacer is flush with the end of the gate electrode in the direction of the gate width, and wherein the semiconductor device structure further comprises lower contact portions and upper contact portions, the lower contact portions being in contact with the source/drain regions and level with the top of the gate stack, and the upper contact portions being in contact with the top of the gate stack and the lower contact portions, respectively, and wherein, on the source/drain regions, the lower contact portions are aligned with the upper contact portions, and the top of the lower contact portions is of the same high as the top of the gate stack.

2. The semiconductor device structure according to claim 1, wherein the material of the channel region includes any one of or a combination of more than one of Si, SiC, GaN, AlGaN, InP, and SiGe.

3. The semiconductor device structure according to claim 1, comprising an insulating layer between the bottom of the channel region and the semiconductor substrate.

4. The semiconductor device structure according to claim 3, wherein, if a shallow trench isolation is formed in the semiconductor substrate, the bottom of the insulating layer is higher than the bottom of the shallow trench isolation.

5. The semiconductor device structure according to claim 3, wherein the insulating layer includes any one of or a combination of ones of $Si_3N_4$, $SiO_2$, SiOx:F, SiCOH, $SiO_x$, $SiO_2$:C, SiCON, and SiONx.

6. The semiconductor device structure according to claim 3, wherein the thickness of the insulating layer is 5-50 nm.

7. The semiconductor device structure according to claim 1, wherein in the direction of the gate width, the distance between adjacent gate stacks is 1-10 nm.

* * * * *